United States Patent [19]
Meier et al.

[11] Patent Number: 5,185,289
[45] Date of Patent: Feb. 9, 1993

[54] PROCESS FOR THE SELECTIVE GROWTH OF GAAS

[75] Inventors: Heinz P. Meier, Thalwil, Switzerland; Edward A. Van Gieson, Santa Rosa, Calif.; Willi Walter, Adliswil, Switzerland

[73] Assignee: International Business Machines Corporation, Armonk, N.Y.

[21] Appl. No.: 720,965

[22] Filed: Jun. 25, 1991

Related U.S. Application Data

[60] Continuation of Ser. No. 617,445, Nov. 21, 1990, abandoned, which is a division of Ser. No. 310,427, Feb. 13, 1989, abandoned.

[30] Foreign Application Priority Data

Jun. 28, 1988 [EP] European Pat. Off. ............... 110302

[51] Int. Cl.$^5$ .......................................... H01L 21/20
[52] U.S. Cl. .................................. 437/129; 437/107; 437/133; 148/DIG. 95
[58] Field of Search ................ 437/107, 129, 133; 148/DIG. 95

[56] References Cited

U.S. PATENT DOCUMENTS

| | | | |
|---|---|---|---|
| 4,097,819 | 6/1978 | Bellavance | 331/94.5 |
| 4,317,086 | 2/1982 | Scifres et al. | 372/49 |
| 4,380,861 | 4/1983 | Sugino et al. | 437/129 |
| 4,512,022 | 4/1985 | Tsang | 372/45 |
| 4,797,374 | 1/1989 | Scott et al. | 437/129 |
| 4,920,069 | 4/1990 | Fossum et al. | 437/107 |

FOREIGN PATENT DOCUMENTS

| | | | |
|---|---|---|---|
| 235324 | 9/1989 | Japan | 437/107 |
| 694 | 1/1987 | World Int. Prop. O. | 437/129 |

OTHER PUBLICATIONS

"Ultralow-threshold graded-index separate-confinement single quantum well buried heterostructure (Al,Ga) As Lasers with high reflectivity coatings," by P. L. Derry, et al., Applied Physics Letter 50 (25), pp. 1773–1775, Jun. 22, 1987.

"Channelled substrate (100) GaAs MBE growth and lateral p-n junction formation of lasers," by H. P. Meier, et al., Inst. Physics Conference Serial No. 91: Ch. 7, pp. 609–612, Paper presented at International Symposium GaAs & Related Compounds, Heraklion, Greece, Sep. 28–Oct. 1, 1987.

"Patterned quantum well semiconductor injection laser grown by molecular beam epitaxy," by E. Kapon, et al., Applied Physics Letter 52 (8), pp. 607–609, Feb. 22, 1988.

"Problems related to the formation of lateral p-n junctions on channel substrate (100) GaAs for lasers," by H. P. Meier, et al., J. Vac. Sci. Technology B6 (2), pp. 692–695, Mar./Apr. 1988.

Primary Examiner—Brian E. Hearn
Assistant Examiner—Linda J. Fleck
Attorney, Agent, or Firm—Aziz M. Ahsan

[57] ABSTRACT

The process is particularly useful in the fabrication of GaAs quantum well (QW) laser diodes. Starting point is a ridge-patterned (100)-substrate (21), the crystal orientation of the sidewalls, e.g., (411A)-oriented, being different from that of the horizontal top. The sidewall facets thus have a lower Ga incorporation rate.

In a molecular beam epitaxy (MBE) system, the lower AlGaAs cladding layer (22) is first grown, followed by the high-temperature growth of the active GaAs QW (23). Due to diffusion and desorption processes, the GaAs thickness at the sidewalls is smaller than on the horizontal top of the ridge. During a short growth interrupt, the GaAs completely desorbs from the sidewall facets. With the subsequent growth of the upper cladding layer (24), the QW becomes laterally embedded in higher bandgap material providing for lateral electric confinement.

18 Claims, 2 Drawing Sheets

PROCESS FOR THE SELECTIVE GROWTH OF GAAS

This is a continuation Patent Application of U.S. patent application Ser. No. 07/617,445, filed on Nov. 21, 1990, continuation based on Ser. No. 07/617,445 now abandoned, which was a divisional Patent Application of U.S. patent application Ser. No. 07/310,427, filed on Feb. 13, 1989, now abandoned.

TECHNICAL FIELD

The invention concerns a process for the selective growth of GaAs on a patterned substrate for use in semiconductor laser diode fabrication. The process is particularly suited for the fabrication of very low threshold current laser devices. The invention also relates to a semiconductor GaAs quantum well (QW) diode laser fabricated by using the selective growth process.

BACKGROUND OF THE INVENTION

Semiconductor diode lasers have found applications in a wide variety of information handling systems because of their compact size and because their technology is compatible with that of the associated electronic circuitry. These lasers are being used in areas such as data communication, optical storage and laser-beam printing and have been optimized for the particular applications with regard to their wavelength, optical power, their high speed modulation capabilities, beam quality, etc. For all applications, however, high performance devices require low threshold current values, i.e., the minimum current that needs to flow through the p-n junction of the laser diode to cause the coherent emission of light, should be as low as possible. This, in turn, results in a reduction of heat development and the associated cooling problems, an important factor particularly in high density packaging applications. Quantum well structures, in general, are well suited since they require lower currents than conventional heterostructures. An additional measure, resulting in a current reduction, is to provide structures with effective current confinement thereby avoiding unnecessary by-pass or stray currents.

Recently, very high performance low threshold current stripe lasers have been proposed where the active region of the laser is embedded within higher bandgap material in order to provide additional lateral carrier and optical confinement.

One such laser structure has been disclosed by P. L. Derry, et al. in an article "Ultralow-threshold graded-index separate-confinement single quantum well buried heterostructure (Al,Ga)As lasers with high reflectivity coatings," (Appl. Phys. Lett. 50 (25), Jun. 22, 1987, pp. 1773–1775).

Described in this article is a buried, graded-index separate-confinement heterostructure (GRINSCH) single quantum well (SQW) laser having a threshold current of below 1 mA. In this laser structure, high bandgap AlGaAs surrounds the active GaAs region in order to prevent carriers from diffusing out of the active region and to also provide for current confinement. The required fabrication process is rather complex involving (1) growing of the laser layers on a flat-surface substrate using molecular beam epitaxy (MBE) techniques, (2) etching grooves to form a ridge-patterned surface structure, and (3) performing a difficult and critical AlGaAs regrowth step using LPE techniques.

A different way of fabricating laser structures with effectively embedded active quantum wells (QW) has been described by E. Kapon. et al. in an article "Patterned quantum well semiconductor injection laser grown by molecular beam epitaxy," (Appl. Phys. Lett. 52 (8), Feb. 22, 1988, pp. 607–609).

Disclosed is an otherwise conventional GaAs/AlGaAs quantum well laser heterostructure that is MBE-grown on an (100)-oriented grooved substrate. Use is made of the fact that lateral variations in the thickness of the quantum wells occur when they are grown on a grooved surface. Due to the thickness variations, lateral patterning of the energy bandgap and the index of refraction is obtained.

Because of the groove geometries, the growth rate normal to the (111) or (411) planes of the groove sidewalls is remarkably lower than the growth rate on the (100)-plane. Injected carriers are confined to a narrow stripe, about 1 $\mu$m wide, at the bottom of the groove because of the larger effective bandgap of the thinner QW layers on both sides of the stripe. Current confinement, desired to prevent the applied injection current from by-passing the p-n junction of the active region, is achieved by proton implantation whereby the walls of the groove are rendered non-conducting, leaving a conductive stripe, about 2 $\mu$m wide, at the bottom of the groove. This additional process step is not self-aligned and thus limits further reduction in device size.

SUMMARY OF THE INVENTION

It is a main object of the present invention to provide a novel process for the selective growth of GaAs on selected surface planes of a patterned substrate surface.

Another object is to provide a reliable, reproducible process for the fabrication of high-performance semiconductor ridge laser structures with embedded active quantum wells, exploiting the difference in surface diffusion and desorption of the different facet planes of the ridge structure.

Still another object is to provide a high-performance quantum well ridge laser structure having its active region completely embedded in the higher bandgap cladding layers of the device.

The invention as claimed is intended to meet these objectives and to remedy the drawbacks hitherto encountered. For a ridge GaAs QW laser, the invention provides a way to embed the active QW in higher bandgap material by selective growth of the QW on the horizontal facet of the ridge structure, leaving the sidewall facets of the ridge exposed to the deposition of the higher bandgap cladding layers. These provide for lateral carrier and current confinement.

The advantages offered by the invention are mainly that the described MBE growth process provides a substantially simplified process for embedding the active quantum well. This reliable, self-aligned process allows the fabrication of high-performance laser structures of very small size, possibly down to sub-micron dimensions. Lasers fabricated in accordance with the inventive method operate at very low threshold current levels resulting in low heat dissipation and thus permitting high packaging densities.

DESCRIPTION OF THE DRAWINGS

One way of carrying out the invention is described in detail below with reference to drawings which illustrate a specific embodiment and in which.

DETAILED DESCRIPTION OF THE INVENTION

Before describing the invention in more detail, reference is made to an article by H. P. Meier, et al. "Channelled Substrate (100) GaAs MBE Growth and Lateral p-n Junction Formation of Lasers" (Proc. Intern. Symp. on GaAs and Related Compounds, Heraklion, Crete, Greece, Sept. 28–Oct. 1, 1987, pp. 609–612).

This paper presents some basic technology background on which the invention is based. It reports on investigations made to better understand the MBE growth mechanism of AlGaAs over (100) ridge structures with (211) or higher order (m11A) sidewalls facets. At growth temperatures in the order of 720° C., Ga diffuses from the A-facets to the (100)-facet, the diffusion and the desorption for Ga being much higher than for Al. As a consequence, the GaAs growth rate, and thus the incorporation rate of Ga, are lower on the A-planes that on the (100) facets. It has also been found that the growth rates and the Al-concentration at the c(100)-facets depends on the ridge width: for narrow ridges, the growth rate is high and the Al-concentration low.

In essence, at high temperatures considerable redistribution of Ga from the sidewall facets to the horizontal ridge plane occurs, leading to an increase in QW thickness on the favored growth (100)-planes.

Further investigations and developments, resulting in modifications and optimization of the earlier findings, have now led to the process of the present invention which can be applied in laser device fabrication. The key novel step in the process, accounting for the progress the process yields, is a growth interrupt phase. It is this step that allows the degree of Ga growth selectively that is required for the fabrication of very high performance lasers.

Figure 1A:
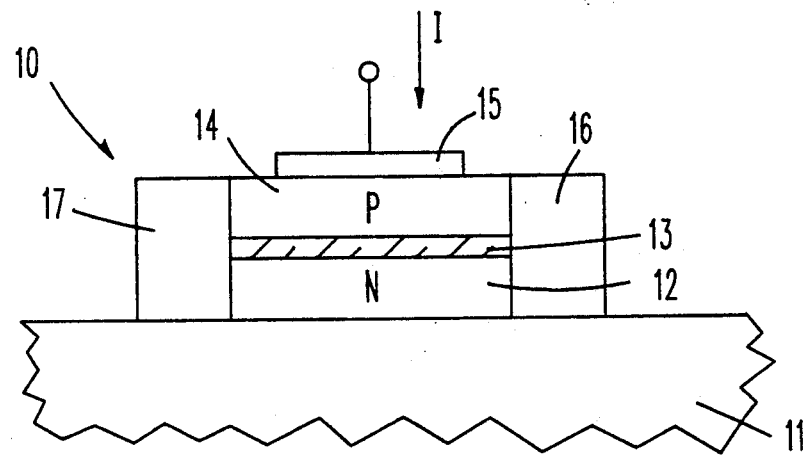
FIG. 1A, is a schematic cross-sectional representation of a QW laser used for the illustration of the structural and operational principles of the laser structure produced in accordance with the inventive process.

Referring now to the drawings and first to FIG. 1A thereof, there is shown a schematic cross-sectional representation of a GaAs laser having an embedded active region. This structure will be used to explain the structural and operational principles of the type of laser device that can be fabricated with the inventive process.

Figure 1B:
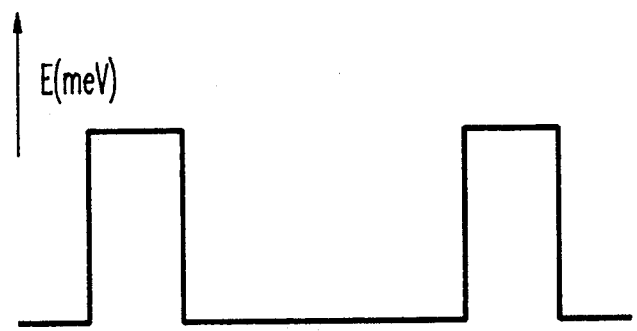
FIG. 1B, illustrates an energy (B) barrier.

Laser structure 10, deposited on the planar surface of a substrate 11, comprises a bottom cladding layer 12, an active layer 13 and an upper cladding layer 14. The active layer 13 consists of GaAs whereas the cladding layers are made of AlGaAs, layer 12 being n-doped, layer 14 p-doped. Upon feeding a current I of a magnitude equal to or higher than that of the threshold current of the device, to electrode 15 (the counterelectrode, connected to the substrate, is not shown), a laser beam is emitted from the active zone in a direction perpendicular to the plane of the drawing. AlGaAs deposits 16 and 17, having a bandgap that is higher than that of the GaAs, embed the active layer 13 providing an energy (E) barrier as illustrated in FIG. 1B. Due to this barrier, carrier confinement is provided, the difference in the refractive index of GaAs and AlGaAs resulting in the required optical confinement.

In FIGS. 2A-2F the steps of the inventive process, applied to fabricate a ridge laser structure having an embedded active quantum well, are illustrated in detail. The successive steps are listed in Table I indicating the correspondence between the steps and the drawings.

TABLE I

| Step No. | Description of Process Step | Figure |
|---|---|---|
| Starting point | A. ((100)-oriented) semiconductor substrate (21) having a ridge patterned surface, the sidewall facets having a crystal orientation (411A) different from that of the horizontal top plane. | 2A |
| 1 | MBE-growth of an n-type lower AlGaAs cladding layer (22). | 2B |
| 2 | High temperature MBE-growth of a GaAs QW layer (23). Due to Ga diffusion and desorption at the sidewalls (23E), preferred GaAs growth on the horizontal plane (23R). | 2C |
| 3 | Short growth interrupt causing complete GaAs removal from the side wall facets. | 2D |
| 4 | MBE-growth of an p-type upper AlGaAs cladding layer (24) embedding the GaAs QW (23R) in higher bandgap material. | 2E |
| 5 | Deposition of the top ohmic contact current electrode (25). Not shown is the deposition of the second current electrode connected to the substrate. | 2F |

Figure 2A:
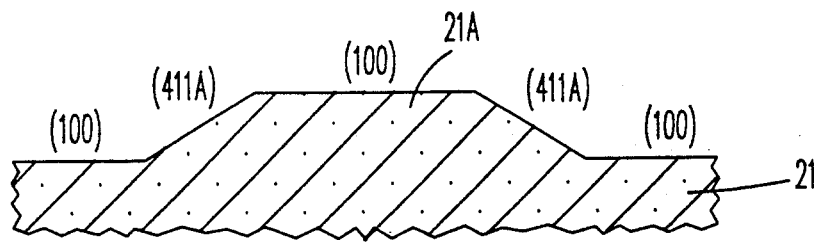
FIGS 2A-2F, are illustrations of the steps of the inventive process used to fabricate a ridge QW laser structure.

Referring now to FIG. 2A, the fabrication process is initiated starting from a n+ GaAs substrate 21 having at least one ridge or mesa 21A on which the laser diode is to be grown. The horizontal facets are (100)-oriented, the sidewalls or edges (411A)-or , more generally, (m11A)-oriented.

The surface pattern shown in FIG. 2A can, for example, be obtained using an (100)-oriented substrate. The desired facets can be etched in an isotropic wet-etch process, using e.g., a 2:1:20 mixture of buffered $HF:H_2O_2:H_2O$ where the $H_2O_2$ concentration determines the angles of the facets.

A stack of semiconductor layers 22 to 24 is then grown on the structured substrate surface using a conventional MBE process as illustrated in FIGS. 2B to 2E.

Figure 2B:
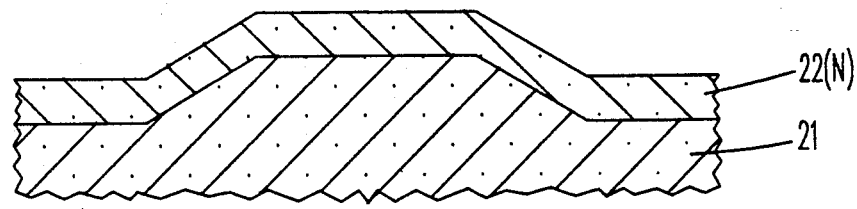

After careful cleaning and loading into the MBE system, the lower AlGaAs cladding layer 22, n-doped, is grown in step 1 at a temperature of about 720° C. (FIG. 2B). With a low arsenic flux, in order not to jeopardize the diffusion and desorption effect, the growth process is controlled to yield a layer of an Al-concentration of x=0.4, the deposited $Al_{0.4}Ga_{0.6}As$ layer having a thickness of about 1.5 μm.

Figure 2C:
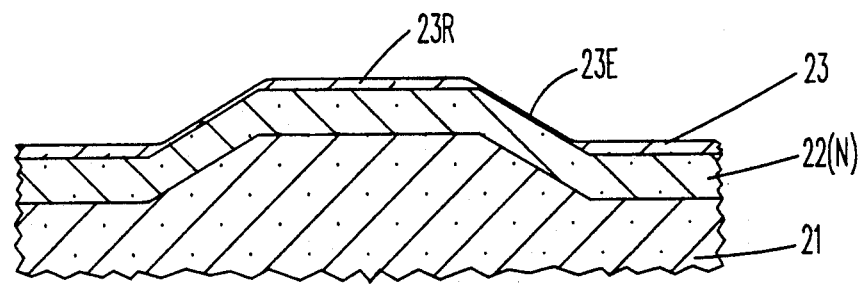

In step 2, illustrated in FIG. 2C, the active layer 23 of undoped GaAs is grown while keeping the temperature at about 720° C. Due to the high surface diffusion and desorption of Ga at the (411A0-facet, deposits of different thickness are obtained. The Ga incorporation rate differs. In the example, growth is continued until the thickness on the (100)-plane on the top of the ridge is about 8 nm (region 23R), the GaAs layers on the sidewall facets being only about 5 nm thick (region 23E).

It is noted that this difference in thickness of the GaAs layer on the (100)-and the (411A)-facets is primarily due to the diffusion and desorption effect. With the low-incline slope of the sidewalls, the differentiation in thickness due to any "geometry effect" of the MBE process is virtually negligible. This is in contrast to the process described in the above referenced article by E. Kapon, et al. where the "geometry effect", in connection with the steep slopes accounts for the thickness variation.

Thereafter, in step 3, growth is interrupted in that the supply of Ga and As is cut off for about 1 minute while still maintaining the high temperature.

Figure 2D:
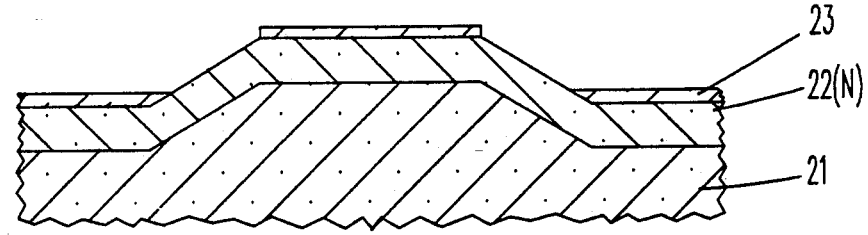

It has been found that, during this growth interrupt, the thin (5 nm) GaAs layer 23E desorbs completely from the sidewall facets exposing the surface of the underlying lower cladding layer 22. The GaAs active layer section 23R at the (100)-facet is now isolated. It forms the active QW of the laser structure. The structure obtained after completion of this most important process step is shown in FIG. 2D.

Figure 2E:
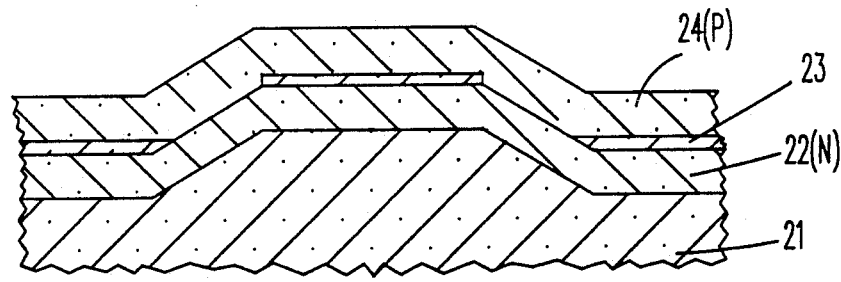

In the subsequent step 4, the upper cladding layer 24, having the same composition $Al_{0.4}Ga_{0.6}As$ as the lower cladding layer 22 but being p-doped, is deposited onto the structure as illustrated in FIG. 2E. The process conditions are the same as those of step 1. The thickness of layer 24 is also about 1.5 μm.

Since the upper cladding layer 24 is, in the (411A)-facet region, directly deposited onto the lower cladding layer 22, the active GaAs QW 23R is completely embedded or engulfed in the higher bandgap AlGaAs cladding layer material. In the completed device, this provides for both, lateral carrier confinement and lateral current confinement.

It should be noted that no additional process step is required for obtaining current confinement. This is in contrast to the processes described in the two prior art references cited in the introduction. There, either an AlGaAs regrowth (in the P. L. Derry, et al. process) or a proton implantation (in the E. Kapon, et al. process) is required.

Figure 2F:
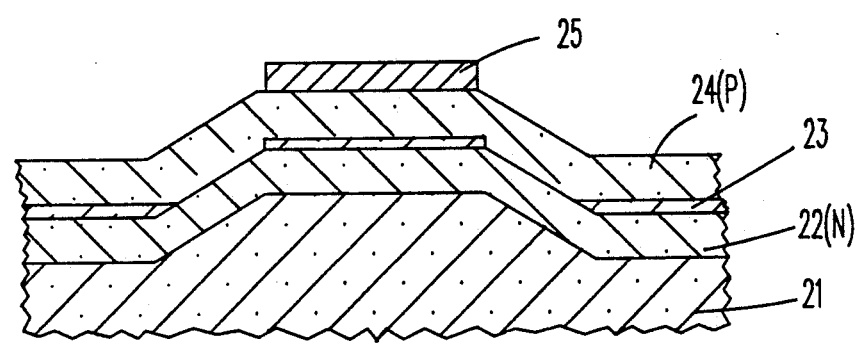

Next, in step 5, reference is now made to FIG. 2F, ohmic contacts for the application of the injection current I to the p-n laser diode are deposited using conventional methods and materials. In the described embodiment, the upper p-contact consists of Ti/Pt/Au whereas the n-contact electrode (not shown in the figure) that is connected to the substrate, is made of Au/Ge/Ni/Au.

With some minor modifications, the above described process can also be used to fabricate different types of semiconductor laser structures. One example is a graded refractive index-separate confinement heterostructure (GRINSCH) laser which permits independent optimization of the optical and the carrier confinement. For a GRINSCH structure, step 1 (FIG. 2B) and step 4 (FIG. 2E) are modified in order to provide for the graded refractive index zone. The bulk of the lower and upper cladding layers, 22 and 24, respectively, is grown as described above. But in the zones adjacent the active layer 23R, these zones of about 0.2 μm thickness being referred to as waveguide layers, the Al-contents are graded from $x=0.4$ at the transition to the respective cladding layer, to $x=0.18$ at the boundary with the active layer 23R. The grading is linear but may also be parabolic or of another characteristic.

Other deviations from the above described fabrication process or from the resulting laser structure may be made without departing from the teaching of the invention. For example, the active region may consist of a multi-QW structure; the GaAs forming the active QW may be doped; the p-n "polarity" may be reversed with the consequence that the junction current needs to flow in the opposite direction, etc. Also, the process parameters, the materials used, the indicated thicknesses and other device parameters required or chosen for the described embodiments, are not to be interpreted in a limiting sense.

Figure 3:
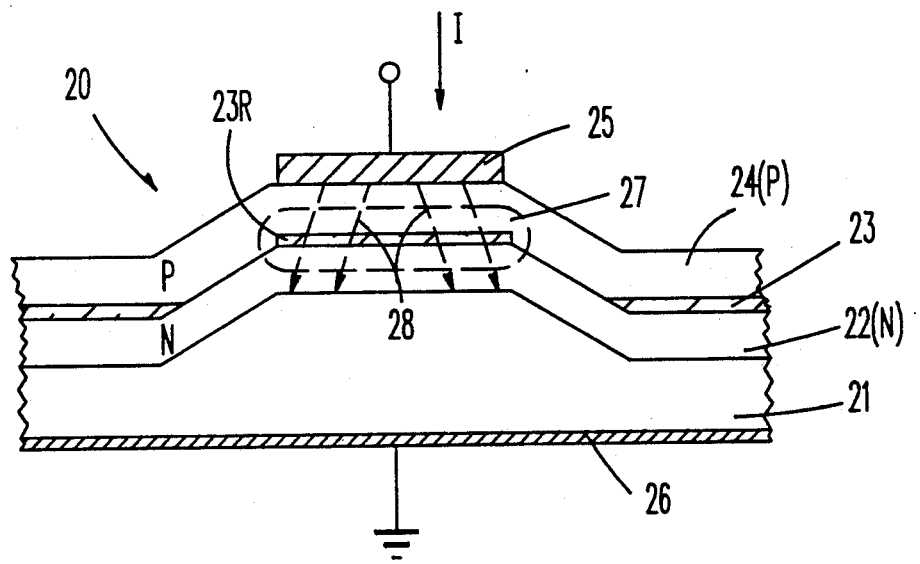
FIG. 3, is a cross-sectional representation of a ridge QW laser structure produced in accordance with the inventive process.

FIG. 3 is a schematic representation of a completed GaAs laser structure that can be fabricated using the above described process. Where appropriate, the same reference numbers have been used for corresponding structural elements as in FIGS. 2A-2F.

The layered semiconductor diode laser structure 20 is grown on a n+ GaAs substrate 21. It comprises n-type lower and p-type upper AlGaAs cladding layers 22 and 24. Active GaAs region 23R, forming a quantum well, is completely embedded in between these layers. The actual laser structure may be of the GRINSCH-type in which case the graded waveguide layers adjacent the active quantum well allow independent optimization of optical and electric properties of the device.

When a current I of a magnitude equal to or above that of the threshold current of the laser is fed from the ohmic contact electrode 25 down through layers 24, 23R and 22 to the substrate 21 and to electrode 26, recombination of carriers in the active quantum well region 23R leads to the emission of light. The light-emitting zone, indicated by the dotted curve 27, includes the quantum well 23R as well as the immediately neighboring zones of the cladding layers 22 and 24.

With the active quantum well 23R completely embedded within the higher bandgap AlGaAs cladding layers, the structure provides for very effective carrier confinement. Since the energy barriers formed in the sidewall regions, as schematically shown in FIG. 1B, prevent injected carriers from diffusing out of the active region.

With the GaAs layer being non-existent in the sidewall regions, the structure also provides for very effective current confinement. Since the turn-on voltage of the p-n junction in the quantum well region is substantially lower than that of the sidewall p-n junctions, the flow of the applied current I through the latter is prevented. The applied current I is confined to the path through the quantum well as indicated by the arrows 28.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for the selective growth of GaAs on a patterned substrate comprising the steps of:
   a) patterning the upper surface of a substrate to provide at least one ridge structure, said ridge having a top surface and side wall facets, such that said side wall facets have a lower Ga incorporation rate than said top surface, b) growing at least a lower layer of a first conductivity type over said upper surface of said substrate, c) forming at least a GaAs layer over said lower layer of first conductivity type, d) interrupting said GaAs layer formation until said GaAs layer completely desorbs from said side wall facets, and e) growing at least an upper layer of a second conductivity type engulfing said GaAs layer.

2. The process of claim 1, wherein said substrate comprises GaAs.

3. The process of claim 1, wherein the top surface of said ridge being (100)-oriented and said sidewall facets are (m11A)-oriented.

4. The process of claim 3, wherein the said sidewall facets are (411A)-oriented.

5. The process of claim 1, wherein said lower and upper layers include a waveguide layer with a graded Al-content.

6. The process of claim 1, wherein the composition of said lower and said upper layer is AlGaAs.

7. The process of claim 1, wherein the composition of said lower and upper layers in $Al_{0.4}Ga_{0.6}As$.

8. The process of claim 6, wherein the composition of said layers varies from about $Al_{0.18}Ga_{0.82}As$ to about $Al_{0.4}Ga_{0.6}As$.

9. The process of claim 1, wherein the temperature at which said lower and upper layers are grown and said GaAs layer is formed is about 720° C.

10. The process of claim 1, wherein the thickness of said lower and upper layers is at least 1.5 $\mu$m.

11. The process of claim 1, wherein a layer of GaAs is grown over said lower layer and said growth is interrupted until said GaAs layer completely desorbs from said side wall facets exposes the surface of said underlying lower layer.

12. The process of claim 11, wherein the growth is interrupted for at least 1 minute.

13. The process of claim 1, wherein said lower and said upper layers have a higher bandgap that said GaAs layer.

14. The process of claim 1, wherein said GaAs layer is doped.

15. The process of claim 1, wherein said upper and lower layers are grown using a MBE process.

16. The process of claim 1, wherein said GaAs layer is formed using a MBE process.

17. The process of claim 1, wherein said lower and said upper layers provide lateral electric confinement to said GaAs layers.

18. The process of claim 1, wherein means for an ohmic contact is provided at the top surface of said upper layer.

* * * * *